(12) United States Patent
Mantese

(10) Patent No.: US 11,598,561 B2
(45) Date of Patent: Mar. 7, 2023

(54) ELECTROCALORIC ELEMENT, A HEAT TRANSFER SYSTEM COMPRISING AN ELECTROCALORIC ELEMENT AND A METHOD OF MAKING THEM

(71) Applicant: Carrier Corporation, Palm Beach Gardens, FL (US)

(72) Inventor: Joseph V. Mantese, Ellington, CT (US)

(73) Assignee: CARRIER CORPORATION, Palm Beach Gardens, FL (US)

(*) Notice: Subject to any disclaimer, the term of this patent is extended or adjusted under 35 U.S.C. 154(b) by 251 days.

(21) Appl. No.: 16/623,343

(22) PCT Filed: Jun. 18, 2018

(86) PCT No.: PCT/US2018/038049
§ 371 (c)(1),
(2) Date: Dec. 16, 2019

(87) PCT Pub. No.: WO2018/232392
PCT Pub. Date: Dec. 20, 2018

(65) Prior Publication Data
US 2021/0148613 A1    May 20, 2021

Related U.S. Application Data

(60) Provisional application No. 62/521,080, filed on Jun. 16, 2017.

(51) Int. Cl.
*F25B 21/00*        (2006.01)

(52) U.S. Cl.
CPC ........ *F25B 21/00* (2013.01); *F25B 2321/001* (2013.01)

(58) Field of Classification Search
CPC .... F25B 21/00; F25B 2321/001; H01L 37/02; Y02B 30/00
See application file for complete search history.

(56) References Cited

U.S. PATENT DOCUMENTS

| 4,757,688 A | 7/1988 | Basiulis et al. |
| 5,888,659 A | 3/1999 | Summerfelt et al. |

(Continued)

FOREIGN PATENT DOCUMENTS

| CN | 104441848 A | 3/2015 |
| CN | 105236960 A | 1/2016 |

(Continued)

OTHER PUBLICATIONS

International Search Report Issued in International Application No. PCT/US2018/038049 dated Sep. 17, 2018; 5 Pages.

(Continued)

*Primary Examiner* — Ana M Vazquez
(74) *Attorney, Agent, or Firm* — Cantor Colburn LLP

(57) ABSTRACT

A method of making an electrocaloric element includes providing an electrocaloric material, forming a first electrode at a first surface of the electrocaloric material, and forming a second electrode at a second surface of the electrocaloric material. The forming of the first electrode includes, or the forming of the second electrode includes, or the forming of each of the first and second electrodes independently includes modifying the respective first and/or second surface of the electrocaloric material with an electrically conductive surface modification.

14 Claims, 1 Drawing Sheet

(56) References Cited

U.S. PATENT DOCUMENTS

| | | | |
|---|---|---|---|
| 8,321,061 B2* | 11/2012 | Anderson | A01G 25/00 700/284 |
| 8,695,353 B2 | 4/2014 | Casasanta | |
| 9,109,818 B2 | 8/2015 | Schwartz et al. | |
| 9,157,669 B2 | 10/2015 | Kruglick | |
| 9,574,802 B2 | 2/2017 | Binek | |
| 9,671,140 B2* | 6/2017 | Kruglick | F25B 21/00 |
| 9,739,510 B2* | 8/2017 | Hassen | F25B 21/00 |
| 2010/0175392 A1 | 7/2010 | Malloy et al. | |
| 2011/0309463 A1 | 12/2011 | Kruglick | |
| 2017/0030611 A1 | 2/2017 | Radcliff et al. | |
| 2017/0074555 A1 | 3/2017 | Cheng et al. | |
| 2020/0126697 A1* | 4/2020 | Trassinelli | H01F 1/015 |

FOREIGN PATENT DOCUMENTS

| | | | |
|---|---|---|---|
| CN | 106505144 A | * | 3/2017 |
| WO | 2012155102 A1 | | 11/2012 |
| WO | 2016194700 A1 | | 12/2016 |
| WO | 2017030529 A1 | | 2/2017 |

OTHER PUBLICATIONS

Tang et al.; "Improved Pyroelectric Properties of CaBi4Ti4O15 Ferroelectrics Ceramics by Nb/Mn Co-Doping for Pyrosensors"; Journal of the American Ceramic Society; vol. 99, Iss. 4; Jan. 21, 2016; pp. 1294-1298.

Written Opinion Issued in International Application No. PCT/US2018/038049 dated Sep. 17, 2018; 9 Pages.

Zhang et al.; "Colossal Room-Temperature Electrocaloric Effect in Ferroelectric Polymer Nanocomposites Using Nanostructured Barium Strontium Titanates"; 20 Pages.

Zhang et al.; "Improved Ferroelectric and Pyroelectric Properties in Mn-Doped Lead Zirconate Titanate Thin Films"; Journal of Applied Physics; vol. 94, No. 8; Oct. 15, 2003; 6 Pages.

Chinese Office Action for Application No. 201880052934.6; dated Nov. 15, 2021; 15 Pages.

Chuan-xin; "Surface Treatment Manual" Published by Beijing University of Technology Press, Xushui Hongyuan Printing Factory, 1st edition, Mar. 2004, 4 Pages.

Qi-sheng, "Physical Properties of Materials (Second Edition)", East China University of Science and Technology Press, Engineering Materials—Physical Properties, 2018, 7 Pages.

* cited by examiner

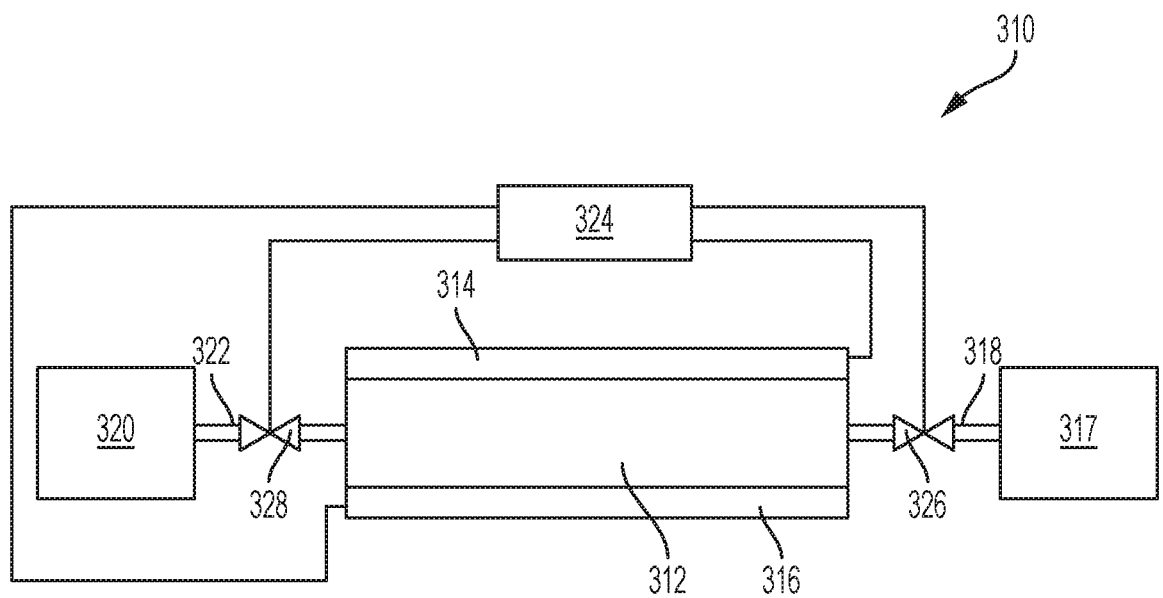

ELECTROCALORIC ELEMENT, A HEAT TRANSFER SYSTEM COMPRISING AN ELECTROCALORIC ELEMENT AND A METHOD OF MAKING THEM

CROSS-REFERENCE TO RELATED APPLICATIONS

This application is the National Stage of International Patent Application No. PCT/US2018/038049 filed Jun. 18, 2018, which claims priority to U.S. Provisional Patent Application No. 62/521,080 filed Jun. 16, 2017, the disclosure of which is incorporated herein by reference in its entirety.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that comprises a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops. Various technologies have been proposed such as field-active heat or electric current-responsive heat transfer systems relying on materials such as electrocaloric materials, magnetocaloric materials, or thermoelectric materials. However, many proposals have been configured as bench-scale demonstrations with limited capabilities for scalability or mass production.

Electrocaloric materials such as electrocaloric films have been proposed for use in heat transfer systems. However, they are subject to a number of potential issues to be addressed when electrocaloric materials are fabricated into electrocaloric elements for use in heat transfer systems, including the fabrication of electrically conductive electrodes used to apply an electric field to the electrocaloric material.

BRIEF DESCRIPTION

In some embodiments, a method of making an electrocaloric element comprises providing an electrocaloric material, forming a first electrode at a first surface of the electrocaloric material, and forming a second electrode at a second surface of the electrocaloric material. The forming of the first electrode comprises, or the forming of the second electrode comprises, or the forming of each of the first and second electrodes independently comprises modifying the respective first and/or second surface of the electrocaloric material with an electrically conductive surface modification.

In some embodiments, a method of making an electrocaloric heat transfer system comprises making an electrocaloric element as described above, thermally connecting the electrocaloric element to a heat sink along a first thermal flow path, thermally connecting the electrocaloric element to a heat source along a second thermal flow path, and electrically connecting the electrodes to an electric power source.

In some embodiments, the method of making an electrocaloric heat transfer system can further comprise connecting the heat transfer system components to a controller configured to selectively apply voltage to activate the electrodes in coordination with heat transfer along the first and second thermal flow paths to transfer heat from the heat source to the heat sink.

In some embodiments, an electrocaloric element comprises an electrocaloric material, a first electrode at a first surface of the electrocaloric material, and a second electrode at a second surface of the electrocaloric material. The first electrode comprises, or the second electrode comprises, or each of the first and second electrodes independently comprises an electrically conductive surface modification of the electrocaloric material.

In some embodiments, a heat transfer system comprises an electrocaloric material, a first electrode at a first surface of the electrocaloric material, a second electrode at a second surface of the electrocaloric material. The system also includes a first thermal flow path between the electrocaloric material and a heat sink and a second thermal flow path between the electrocaloric material and a heat source. An electric power source is connected to the electrodes. The first electrode comprises, or the second electrode comprises, or each of the first and second electrodes independently comprises an electrically conductive surface modification of the electrocaloric material.

In some embodiments, the heat transfer system can also include a controller configured to selectively apply voltage to activate the electrodes in coordination with heat transfer along the first and second thermal flow paths to transfer heat from the heat source to the heat sink.

In any one or combination of the above embodiments, the electrically conductive surface modification can comprise an atomic or molecular modification of the electrocaloric material at said first surface or second surface or first and second surfaces.

In any one or combination of the above embodiments, the electrically conductive surface modification can comprise ions implanted in the electrocaloric material at said first surface or second surface or first and second surfaces.

In any one or combination of the above embodiments, the electrically conductive surface modification can comprise a dopant selectively present at the surface that provides charge carriers, either electrons or electron holes, at said first surface or second surface or first and second surfaces.

In any one or combination of the above embodiments, the electrically conductive surface modification can comprise atomic or molecular defects in the electrocaloric material selectively present at the surface at said first surface or second surface or first and second surfaces.

In any one or combination of the above embodiments, the electrically conductive surface modification can comprise a substituent covalently or ionically bonded to the polymeric electrocaloric material at said first surface or second surface or first and second surfaces.

In any one or combination of the above embodiments, the electrically conductive surface modification can comprise a surface layer comprising the electrocaloric material and an electrically-conductive additive at the first surface or the second surface or the first and second surfaces.

In any one or combination of the above embodiments, the electrocaloric material can comprise either an electrocaloric ceramic composition or an electrocaloric polymer composition, and wherein the electrically conductive surface modification comprises a surface layer comprising an electrically-conductive polymer composition if the electrocaloric material comprises the electrocaloric polymer composition, or the electrically conductive surface modification comprises a surface layer comprising an electrically-conductive ceramic composition if the electrocaloric material comprises the electrocaloric ceramic composition.

In any one or combination of the above embodiments, the bulk electrocaloric material can have an electrical resistivity >1×1010 Ω-cm, and the electrically conductive surface modification has a surface resistance <100 Ω/square.

In some embodiments, the electrically conductive surface modification can have a surface resistance <10 Ω/square.

In some embodiments, the electrically conductive surface modification can have a surface resistance <1 Ω/square.

BRIEF DESCRIPTION OF THE DRAWINGS

Subject matter of this disclosure is particularly pointed out and distinctly claimed in the claims at the conclusion of the specification. The foregoing and other features, and advantages of the present disclosure are apparent from the following detailed description taken in conjunction with the accompanying drawings in which:

The FIGURE is a schematic depiction of an example embodiment of heat transfer system comprising an electrocaloric element and other components.

DETAILED DESCRIPTION

As mentioned above, a method of making an electrocaloric element includes providing an electrocaloric material and forming electrodes at surfaces of the electrocaloric material. Providing the electrocaloric material can involve manufacturing an electrocaloric material, or obtaining electrocaloric material from a materials manufacture and forming it into a desired shape configuration. Electrocaloric materials for electrocaloric elements can be configured in various shapes. In some embodiments, the electrocaloric material can be configured as a thin film. In some embodiments, a film thicknesses for an electrocaloric material can be in a range with a lower end of 0.1 µm, 0.5 µm, or 1 µm, and an upper end of 1000 µm, 100 µm, or 10 µm. The above upper and lower range endpoints can be independently combined to form a number of ranges, and ranges representing each possible combination of range endpoints are hereby expressly disclosed. Examples of electrocaloric materials can include but are not limited to inorganic materials and electrocaloric polymers. Examples of inorganics include but are not limited to PbTiO3 ("PT"), Pb(Mg1/3Nb2/3)O3 ("PMN"), PMN PT, LiTaO3, barium strontium titanate (BST) or PZT (lead, zirconium, titanium, oxygen). Examples of electrocaloric polymers include, but are not limited to ferroelectric polymers, liquid crystal polymers, and liquid crystal elastomers.

Ferroelectric polymers are crystalline polymers, or polymers with a high degree of crystallinity, where the crystalline alignment of polymer chains into lamellae and/or spherulite structures can be modified by application of an electric field. Such characteristics can be provided by polar structures integrated into the polymer backbone or appended to the polymer backbone with a fixed orientation to the backbone. Examples of ferroelectric polymers include polyvinylidene fluoride (PVDF), polytriethylene fluoride, odd-numbered nylon, copolymers containing repeat units derived from vinylidene fluoride, and copolymers containing repeat units derived from triethylene fluoride. Polyvinylidene fluoride and copolymers containing repeat units derived from vinylidene fluoride have been widely studied for their ferroelectric and electro caloric properties. Examples of vinylidene fluoride-containing copolymers include copolymers with methyl methacrylate, and copolymers with one or more halogenated co-monomers including but not limited to trifluoroethylene, tetrafluoroethylene, chlorotrifluoroethylene, trichloroethylene, vinylidene chloride, vinyl chloride, and other halogenated unsaturated monomers.

In some embodiments, the electrocaloric material can comprise a copolymer of a monomer mixture comprising (i) vinylidene fluoride (VF), (ii) an addition polymerization monomer selected from tetrafluoroethylene, trifluoroethylene, or a monomer smaller than trifluoroethylene, and (iii) a halogenated addition polymerization monomer different than (ii) that is larger than vinylidene fluoride. In some embodiments, the monomer (ii) comprises TrFE. In some embodiments, the monomer (ii) comprises tetrafluoroethylene (TFE). In some embodiments, the monomer (ii) comprises a monomer smaller than TrFE, such as vinyl fluoride (VF) or ethylene. In some embodiments, the monomer (ii) comprises a combination of two or more of the above monomers. Examples of the monomer (iii) include but are not limited to chlorofluoroethylene (CFE), chlorotrifluoroethylene (CTFE), hexafluoropropylene (HFP), vinylidene chloride (VDC) 1,1-difluoropropylene (DFP), 2,3,3,3-tetrafluoropropylene (TFP). In some embodiments, the monomer (iii) comprises CFE or a halogenated polymerizable monomer larger than CTFE. In some embodiments, the monomer (iii) comprises CFE. Chlorine substituents in the monomer (iii) or other monomers in the copolymer can be randomly distributed along the copolymer backbone, or they can have an ordered distribution along the backbone as described in patent application PCT/US16/39609, the disclosure of which is incorporated herein by reference in its entirety. Examples of copolymers include, but are not limited to P(VDF-TrFE-CFE), P(VDF-TrFE-CTFE), P(VDF-TrFE-HFP), P(VDF-TrFE-TFE), P(VDF-TrFE-VDC), P(VDF-TFE-CFE), P(VDF-TFE-CTFE), P(VDF-TFE-HFP), P(VDF-TFE-VDC), P(VDF-TrFE-DFP), P(VDF-TrFE-TFP), P(VDF-VF-CFE), P(VDF-VF-TFP), P(VDF-TrFE-TFP), P(VDF-TrFE-VF-CFE), P(VDF-VF-CFE-TFP) and mixtures thereof. The amounts of the respective monomers in the copolymer can vary depending on desired properties of the copolymer. In some example embodiments, the monomer (i) can be present in an amount in a range having a low end of 45 mole %, more specifically 50 mole %, and more specifically 55 mole %, and an upper end of 75 mole %, more specifically 70 mole %, and more specifically 65 mole %. In some example embodiments, the monomer (ii) can be present in an amount in a range having a low end of 20 mole %, more specifically 22 mole %, and more specifically 25 mole %, and an upper end of 38 mole %, more specifically 35 mole %, and more specifically 33 mole %. In some example embodiments, the monomer (iii) can be present in an amount in a range having a low end of 2 mole %, more specifically 4 mole %, and more specifically 6 mole %, and an upper end of 12 mole %, more specifically 10 mole %, and more specifically 8 mole %. The above upper and lower range endpoints can be independently combined to disclose a number of different ranges, each of which is hereby explicitly disclosed.

Liquid crystal polymers, or polymer liquid crystals comprise polymer molecules that include mesogenic groups. Mesogenic molecular structures are well-known, and are often described as rod-like or disk-like molecular structures having electron density orientations that produce a dipole moment in response to an external field such as an external electric field. Liquid crystal polymers typically comprise numerous mesogenic groups connected by non-mesogenic molecular structures. The non-mesogenic connecting structures and their connection, placement and spacing in the polymer molecule along with mesogenic structures are important in providing the fluid deformable response to the external field. Typically, the connecting structures provide stiffness low enough so that molecular realignment is induced by application of the external field, and high enough to provide the characteristics of a polymer when the external field is not applied.

In some exemplary embodiments, a liquid crystal polymer can have rod-like mesogenic structures in the polymer backbone separated by non-mesogenic spacer groups having flexibility to allow for re-ordering of the mesogenic groups in response to an external field. Such polymers are also known as main-chain liquid crystal polymers. In some exemplary embodiments, a liquid crystal polymer can have rod-like mesogenic structures attached as side groups attached to the polymer backbone. Such polymers are also known as side-chain liquid crystal polymers.

Examples of main-chain liquid crystal polymers include those having the repeating structures shown with C10 and C8 polyethylene spacer groups, respectively:

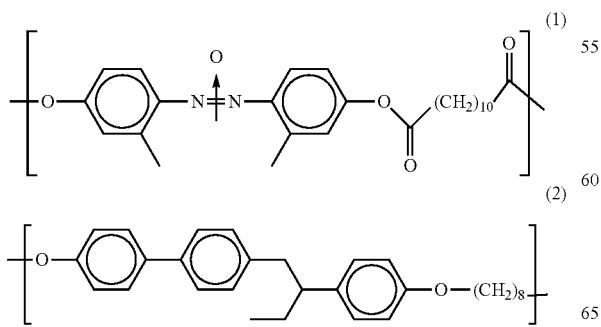

Examples of side-chain liquid crystal polymers include those having the repeating structures shown with C4 and C10 polyethylene spacer groups, respectively:

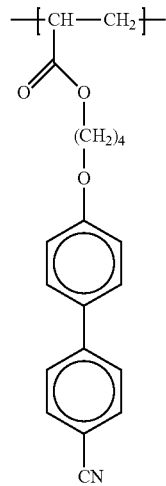

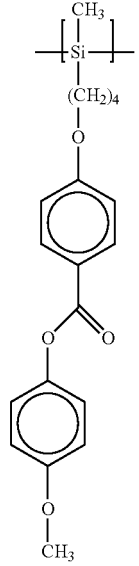

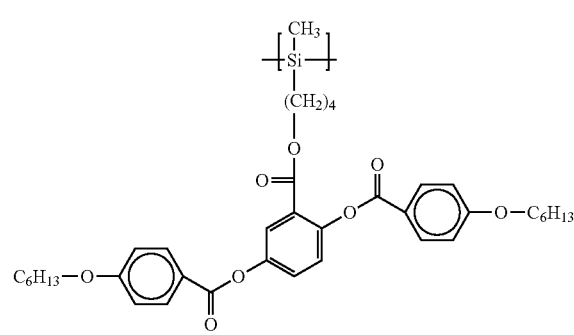

Of course, the above structures are exemplary. Many other liquid crystal polymers are known, and can be readily utilized by the skilled person.

In some embodiments liquid crystal elastomers can be based on liquid crystal polymers that have been modified with crosslinking. The crosslink density can be adjusted to be low enough so that local molecular flexibility is retained to allow nematic or smectic ordering of the mesogenic groups in response to an external field. However, the crosslink density can be set high enough to produce a macro elastic deformation response of the polymer to the external field instead of the Brownian molecular motion that results in a fluid, non-elastic macro response to the external field. The crosslinking reaction can rely on any type of crosslinking mechanism such as including tri- or higher-functional monomer in the monomer reactants during polymerization or by including functional side groups such as hydroxyl attached to the polymer chain, which can be reacted with a crosslinking agent such as a diisocyanate. The functional side groups can be selected to result in a mesogenic group integrated in the crosslink chain, or the mesogenic groups can be attached as side groups on the polymer chain separate from crosslink chains that are non-mesogenic. Many liquid crystal elastomers are known, and can be readily utilized by the skilled person.

As mentioned above, first and second electrodes are formed at first and second surfaces, respectively, of the electrocaloric material, and the first electrode or the second electrode or each of the first and second electrodes independently comprises an electrically surface modification of the electrocaloric material at the first and/or second surface, respectively. As used herein, the term surface modification means a modification on or at a surface of the electrocaloric material/electrode interface and optionally also in a local zone or region of the electrocaloric material adjacent to that surface that does not extend through the electrocaloric material between the electrodes. As the surface modification is electrically conductive, an extension of the modification through the material would create an electrically conductive path through the dielectric electrocaloric material that would short circuit the electrode separation needed to create an electric field for electrocaloric operation.

In some embodiments, the electrically conductive surface modification can include atomic or molecular modification of the electrocaloric material at the relevant surface. In some embodiments, the bulk electrocaloric material can have an electrical resistivity >1×10$^{10}$ Ω-cm, and the electrically conductive surface modification can have a surface resistance <100 Ω/square. In some embodiments, the electrically conductive surface modification can have a surface resistance <10 Ω/square. In some embodiments, the electrically conductive surface modification has a surface resistance <1 Ω/square. The term "ohms per square" is a term of art that is used to represent the number of actual squares in a metal pattern from the electrode. For example, if the bus bar sees a width of 4 inches and the length is 1 inch, then it is 4 squares, i.e., the width divided by the length. The surface resistance is the resistivity divided by the thickness. Hence one only needs to multiply by the length and divide by the width (or alternatively, divide by the number of squares). The atomic or molecular modification can be carried out in various ways. In some embodiments, ion implantation techniques to penetrate energetic ions into the surface of the material to produce charge donors or acceptors. Ion implantation can be carried out by forming positive or negative ions with electron bombardment of a gas comprising ionizable atoms or molecules, and electromagnetically accelerating and focusing the ions into a beam directed onto a target substrate. A magnetic separator and aperture interposed in the beam can limit the ions passing through the separator to those of target mass and energy/charge values. The energy of the ions and their composition and that of the target will determine the depth of ion penetration into the target. In some embodiments, the penetration depth can range from 10 nm to 1 µm. Ions gradually lose their energy as they travel through the solid electrocaloric material, both from occasional collisions with target atoms and from drag due to overlap of electron orbitals. In some embodiments, the loss of ion energy in the target can prevent the ions from penetrating through the electrocaloric material. In some embodiments, the ion energy of the ion beam can be in a range having a low end of 1 keV, 5 keV, 10 keV, or 10 keV, and an upper end of 500 keV, 250 keV, 150 keV or 100 keV. The above upper and lower range endpoints can be independently combined to disclose a number of different ranges, each of which is hereby explicitly disclosed. The loading quantity of ions implanted into the electrocaloric material can be controlled by factors such as the duration of exposure of the material to the ion beam. In some embodiments, ion implantation can provide an ion implantation dose in a range with a low end of 1×10$^{17}$ ions/cm2, 1×10$^{18}$ ions/cm2, or 1×10$^{19}$ ions/cm2, and an upper end of 1×10$^{20}$ ions/cm2, 1×10$^{21}$ ions/cm2, or 1×10$^{22}$ ions/cm2. The above upper and lower range endpoints can be independently combined to disclose a number of different ranges, each of which is hereby explicitly disclosed. Ion implantation can be implemented with either polymeric or ceramic electrocaloric materials. In some embodiments, the implanted ion species can be selected to substitute for A ion in an ABO3 perovskite structure or ionic group in the electrocaloric material. Examples of ion source materials and corresponding ions implanted include, but are not limited to La, Mn, Nb, Ta, V, Mg.

Another form of atomic or molecular surface modification can include dopants introduced to surface portion(s) (optionally including a local zone or region adjacent to the surface) of the electocaloric material during manufacture. Dopants can include electron donor or acceptor atoms or groups of atoms that substitute for other atoms in a crystal lattice structure of a ceramic electrocaloric material or are in solid solution with a ceramic or polymeric electrocaloric material. In some embodiments, the dopant selectively present at the surface can provide charge carriers, either electrons or electron holes at the surface. The introduction of dopant at or near the surface can be accomplished by adding to or rapidly increasing an amount of dopants in a liquid, powder, or vapor phase precursor of the electrocaloric material selectively during synthesis or fabrication of a surface portion of the electrocaloric material. Examples of dopants include Na, As, B, S, Sb, P.

Another form of atomic or molecular surface modification can include defects in the atomic or molecular structure of the electrocaloric material that are capable of providing an electrical conductivity property. Such defects can be formed by exposing the electrocaloric surface to an ion beam such as described above for ion implantation, but producing electrical conductivity primarily through the electronically active effect of defects in the molecular structure resulting from impact by ions. For example, implantation with heavy ions such as Ar, He, Kr, Ze, Sb, can produce local defects to ceramic crystal structure disassociation or polymer chain scission. The electronically active effect of such defects can be an alternative to or in addition to electronically active effects produced by the implanted ions themselves or their interaction with the electrocaloric material atomic or molecular structure.

Another form of atomic or molecular surface modification can include defects in the atomic or molecular structure of the electrocaloric material that are capable of providing an electrical conductivity property. Such defects can be formed by exposing the electrocaloric surface to an electron beam, producing electrical conductivity primarily through the electronically active effect of defects in the molecular structure resulting from impact by electronics.

In some embodiments in which the electrocaloric material comprises an electrocaloric polymer, an atomic or molecular surface modification can comprise substituent(s) covalently or ionically bonded to electrocaloric polymer molecules at the surface of the material. The substituents can include electron donor and/or electron acceptor groups to provide an electrical conductive effect. Examples of potential substituents include N, Si, As, Sb, Bi. Combinations of substituents can be used to further enhance the electrical conductive effect. Selective chemical bonding of electrical conductivity-inducing substituents at the surface of the electrocaloric material can be accomplished by introducing the substituted polymer molecules during fabrication. The chemical bonding can be accomplished by introducing electrically conductive polymer molecules during at a location of fabrication of a surface portion of the electrocaloric material. Alternatively, a functional group can be included bonded to the polymer molecule that can be reacted or displaced (e.g., with wet or vapor chemistry) or converted (e.g., by heat or light) to form a conductivity-enhancing group bonded to the polymer molecule at the exposed surface of the electrocaloric material.

In some embodiments, an electrically conductive surface modification can comprise an electrically conductive cladding or surface layer that is compatible with the underlying electrocaloric material. If the electrocaloric material comprises an electrocaloric ceramic composition, the compatible conductive cladding or surface layer comprises an electrically-conductive ceramic composition. The ceramic cladding or surface layer composition can include dopants to provide or enhance electrical conductivity, and can include other compositional variations from the underlying electrocaloric material for various purposes such as to enhance the electrical conductive effect of the dopant(s). The cladding or surface layer can be applied as a green ceramic tape that is co-formed as an outermost surface tape layer with other green ceramic tapes for the electrocaloric material, followed by sintering. Similarly with polymeric electrocaloric compositions, a cladding or surface layer can include an electrically-conductive polymer (including polymers with electrical conductivity-producing substituents) that is co-extruded with a base support of electrocaloric polymer. The polymeric cladding or surface layer composition can include dopants and/or substituents on the polymer molecule to provide or enhance electrical conductivity, and can include other compositional variations from the underlying electrocaloric material for various purposes such as to enhance the electrical conductive effect of the dopant(s). Examples of compositional pairings of electrocaloric material and cladding include lanthanum strontium chromite or lanthum strontium cobalt, lanthanum doped strontium titanate, etc.

An example embodiment of a heat transfer system and its operation are further described with respect to the FIGURE. As shown in the FIGURE, a heat transfer system 310 comprises an electrocaloric element comprising an electrocaloric film 312 having electrodes 314 and 316 on opposite surfaces thereof. Multiple electrocaloric elements configured in a stack can also be used. The electrocaloric element is in thermal communication with a heat sink 317 through a first thermal flow path 318, and in thermal communication with a heat source 320 through a second thermal flow path 322. The thermal flow paths are described below with respect thermal transfer through flow of a heat transfer fluid through control valves 326 and 328 between the electrocaloric element and the heat sink and heat source, but can also be through conductive heat transfer through solid state heat thermoelectric switches in thermally conductive contact with the electrocaloric element and the heat source or heat sink, or thermomechanical switches in movable to establish thermally conductive contact between the electrocaloric element and the heat source or heat sink. A controller 324 is configured to control electrical current to through a power source (not shown) to selectively activate the electrodes 314, 316. The controller 324 is also configured to open and close control valves 326 and 328 to selectively direct the heat transfer fluid along the first and second flow paths 318 and 322.

In operation, the system 310 can be operated by the controller 324 applying an electric field as a voltage differential across the electrocaloric element to cause a decrease in entropy and a release of heat energy by the electrocaloric elements. The controller 324 opens the control valve 326 to transfer at least a portion of the released heat energy along flow path 318 to heat sink 317. This transfer of heat can occur after the temperature of the electrocaloric elements has risen to a threshold temperature. In some embodiments, heat transfer to the heat sink 317 is begun as soon as the temperature of the electrocaloric elements increases to be about equal to the temperature of the heat sink 317. After application of the electric field for a time to induce a desired release and transfer of heat energy from the electrocaloric elements to the heat sink 317, the electric field can be removed. Removal of the electric field causes an increase in entropy and a decrease in heat energy of the electrocaloric elements. This decrease in heat energy manifests as a reduction in temperature of the electrocaloric elements to a temperature below that of the heat source 320. The controller 324 closes control valve 326 to terminate flow along flow path 318, and opens control device 328 to transfer heat energy from the heat source 320 to the colder electrocaloric elements in order to regenerate the electrocaloric elements for another cycle.

In some embodiments, for example where a heat transfer system is utilized to maintain a temperature in a conditioned space or thermal target, the electric field can be applied to the electrocaloric elements to increase its temperature until the temperature of the electrocaloric element reaches a first threshold. After the first temperature threshold, the controller 324 opens control valve 326 to transfer heat from the electrocaloric elements to the heat sink 317 until a second temperature threshold is reached. The electric field can continue to be applied during all or a portion of the time period between the first and second temperature thresholds, and is then removed to reduce the temperature of the electrocaloric elements until a third temperature threshold is reached. The controller 324 then closes control valve 326 to terminate heat flow transfer along heat flow path 318, and opens control valve 328 to transfer heat from the heat source 320 to the electrocaloric elements. The above steps can be optionally repeated until a target temperature of the conditioned space or thermal target (which can be either the heat source or the heat sink) is reached.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are com-

What is claimed is:

1. A method of making an electrocaloric element, comprising:
providing an electrocaloric material;
forming a first electrode at a first surface of the electrocaloric material; and
forming a second electrode at a second surface,
wherein at least one of the first electrode and the second electrode is formed by modifying the respective first surface and second surface of the electrocaloric material with an electrically conductive surface modification;
wherein the electrically conductive surface modification comprises an atomic or molecular modification of the electrocaloric material at said first surface or second surface or first and second surfaces.

2. A method of making an electrocaloric heat transfer system, comprising making an electrocaloric element according to the method of claim 1, thermally connecting the electrocaloric element to a heat sink along a first thermal flow path, thermally connecting the electrocaloric element to a heat source along a second thermal flow path, and electrically connecting the electrodes to an electric power source.

3. The method of claim 2, further comprising connecting the heat transfer system components to a controller configured to selectively apply voltage to activate the electrodes in coordination with heat transfer along the first and second thermal flow paths to transfer heat from the heat source to the heat sink.

4. An electrocaloric element, comprising:
an electrocaloric material;
a first electrode at a first surface of the electrocaloric material; and
a second electrode at a second surface of the electrocaloric material,
wherein the first electrode comprises, or the second electrode comprises, or each of the first and second electrodes independently comprises an electrically conductive surface modification of the electrocaloric material;
wherein the electrically conductive surface modification comprises an atomic or molecular modification of the electrocaloric material at said first surface or second surface or first and second surfaces.

5. A heat transfer system, comprising:
an electrocaloric material;
a first electrode at a first surface of the electrocaloric material;
a second electrode at a second a surface of the electrocaloric material;
a first thermal flow path between the electrocaloric material and a heat sink;
a second thermal flow path between the electrocaloric material and a heat source; and
an electric power source connected to the electrodes,
wherein the first electrode comprises, or the second electrode comprises, or each of the first and second electrodes independently comprises an electrically conductive surface modification of the electrocaloric material;
wherein the electrically conductive surface modification comprises an atomic or molecular modification of the electrocaloric material at said first surface or second surface or first and second surfaces.

6. The heat transfer system of claim 5, further comprising a controller configured to selectively apply voltage to activate the electrodes in coordination with heat transfer along the first and second thermal flow paths to transfer heat from the heat source to the heat sink.

7. The heat transfer system of claim 5, wherein the electrocaloric material comprises an electrocaloric polymer.

8. The heat transfer system of claim 5, wherein the electrocaloric material comprises an electrocaloric ceramic.

9. The heat transfer system of claim 5, wherein the electrically conductive surface modification comprises atomic or molecular defects in the electrocaloric material selectively present at the surface at said first surface or second surface or first and second surfaces.

10. The heat transfer system of claim 5, wherein the electrocaloric material has an electrical resistivity $>1\times10^{10}$ $\Omega$-cm, and the electrically conductive surface modification has a surface resistance <100 $\Omega$/square.

11. The heat transfer system of claim 10, wherein the electrically conductive surface modification has a surface resistance <10 $\Omega$/square.

12. The heat transfer system of claim 10, wherein the electrically conductive surface modification has a surface resistance <1 $\Omega$/square.

13. The heat transfer system of claim 5, wherein the electrically conductive surface modification does not extend through the electrocaloric material between the first electrode and the second electrode.

14. The heat transfer system of claim 5 wherein the first electrode, or the second electrode, or each of the first and second electrodes is integrated in the electrocaloric material.

* * * * *